(12) United States Patent
Ding et al.

(10) Patent No.: US 11,200,397 B2
(45) Date of Patent: Dec. 14, 2021

(54) FINGERPRINT IDENTIFICATION ASSEMBLY, DISPLAY SUBSTRATE, DISPLAY PANEL AND FINGERPRINT IDENTIFICATION METHOD

(71) Applicant: BOE TECHNOLOGY GROUP CO., LTD., Beijing (CN)

(72) Inventors: Xiaoliang Ding, Beijing (CN); Haisheng Wang, Beijing (CN); Yingming Liu, Beijing (CN); Lei Wang, Beijing (CN); Yapeng Li, Beijing (CN); Jiabin Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/911,382

(22) Filed: Jun. 24, 2020

(65) Prior Publication Data

US 2021/0192171 A1 Jun. 24, 2021

(30) Foreign Application Priority Data

Dec. 20, 2019 (CN) .......................... 201911329951.2

(51) Int. Cl.
*G06K 9/00* (2006.01)
*G06F 1/16* (2006.01)

(52) U.S. Cl.
CPC ......... *G06K 9/0004* (2013.01); *G06F 1/1609* (2013.01); *G06K 9/0008* (2013.01)

(58) Field of Classification Search
None
See application file for complete search history.

(56) References Cited

U.S. PATENT DOCUMENTS

| 8,355,545 B2 * | 1/2013 | Corcoran ........... G06K 9/00046 382/124 |
| 2017/0221960 A1 * | 8/2017 | Lin ................... H01L 27/14678 |
| 2018/0217430 A1 * | 8/2018 | Ding ................... H01L 27/1214 |
| 2019/0228203 A1 * | 7/2019 | Kim .................. G02B 27/0955 |
| 2020/0193120 A1 * | 6/2020 | Chen ..................... H01L 27/323 |
| 2020/0401782 A1 * | 12/2020 | Cheng ................. G06K 9/0004 |

* cited by examiner

*Primary Examiner* — Joseph R Haley
(74) *Attorney, Agent, or Firm* — McDermott Will & Emery LLP

(57) ABSTRACT

A fingerprint identification assembly is disclosed. The fingerprint identification assembly includes first point light sources for emitting first signal light; second point light sources for emitting second signal light after the first point light source emits the first signal light; light sensitive units configured to sequentially receive the first signal light and the second signal light reflected by a finger; and an optical filter layer provided on a light entry side of the light sensitive unit. The optical filter layer includes first filter units, the first filter unit corresponds to a non-imaging area that is formed on the light sensitive units after the first point light source is lit, for preventing the first signal light reflected by the finger from irradiating the non-imaging area of the light sensitive units, and allowing the second signal light reflected by the finger to irradiate the non-imaging area of the light sensitive units.

18 Claims, 5 Drawing Sheets

FINGERPRINT IDENTIFICATION ASSEMBLY, DISPLAY SUBSTRATE, DISPLAY PANEL AND FINGERPRINT IDENTIFICATION METHOD

CROSS-REFERENCE TO RELATED APPLICATION

This application claims priority to Chinese Patent Application No. 201911329951.2 filed on Dec. 20, 2019, the disclosure of which is incorporated herein by reference in its entirety.

TECHNICAL FIELD

Embodiments of the present disclosure relates to the field of fingerprint identification technology, and in particular, to a fingerprint identification assembly, a display substrate, a display panel and a fingerprint identification method.

BACKGROUND

Mobile phones usually have a fingerprint identification assembly. For convenience, fingerprint identification is usually performed on the display area.

SUMMARY

Embodiments of the present disclosure provide a fingerprint identification assembly, comprising: a plurality of first point light sources, configured to emit a first signal light; a plurality of second point light sources configured to emit a second signal light after the first point light source emits the first signal light, the first signal light and the second signal light being lights of different colors; a plurality of light sensitive units configured to sequentially receive the first signal light and the second signal light reflected by a finger to identify a fingerprint; and an optical filter layer provided on a light entry side of the light sensitive unit, wherein the optical filter layer comprises a plurality of first filter units, the first filter unit corresponds to a non-imaging area that is formed on the light sensitive units after the first point light source is lit, for preventing the first signal light reflected by the finger from irradiating at least a predetermined portion of the non-imaging area of the light sensitive units, and allowing the second signal light reflected by the finger to irradiate the non-imaging area of the light sensitive units.

In some embodiments, the optical filter layer further comprises second optical filter units, the second optical filter units are disposed in all areas of the optical filter layer except the first optical filter units, and the second optical filter unit is configured to filter out ambient light passing through the finger.

In some embodiments, a first wavelength of the first signal light emitted by the first point light source is greater than a second wavelength of the second signal light emitted by the second point light source.

In some embodiments, the first optical filter unit is configured to filter out light having a wavelength greater than or equal to a third wavelength and to transmit light having a wavelength less than the third wavelength, and the third wavelength is less than or equal to the first wavelength and greater than the second wavelength.

In some embodiments, the first point light source is a point light source configured to emit green light, and the second point light source is a point light source configured to emit blue light; and the first optical filter unit is configured to filter out light with a wavelength greater than or equal to 490 nm, and the second optical filter unit is configured to filter out light with a wavelength greater than or equal to 650 nm.

In some embodiments, each of the light sensitive units comprises: a light sensitive diode configured to sense a light intensity change produced by finger pressing; and a first thin film transistor configured to control an output of the light sensitive diode.

In some embodiments, in a predetermined arrangement direction, a plurality of light sensitive unit groups in the plurality of light sensitive units are arranged alternately with a plurality of point light sources composed of the plurality of first point light sources and the plurality of second point light sources, and the plurality of first point light sources and the plurality of second point light sources are alternately arranged, and each of the plurality of light sensitive unit groups comprises at least one light sensitive unit.

In some embodiments, each of the plurality of light sensitive unit groups comprises a plurality of light sensitive units; and, the first optical filter unit are provided only at the light entry sides of one or more light sensitive units which belong to the light sensitive unit group between the adjacent first point light source and second point light source in the predetermined arrangement direction and which are closer to the first point light source than to the second point light source in the predetermined arrangement direction.

In some embodiments, in a predetermined arrangement direction, the plurality of first point light sources and the plurality of second point light sources are alternately arranged, and the plurality of first point light sources and the plurality of second point light sources are disposed at light entry side of the plurality of light sensitive units, and one first optical filter unit is provided only between each of the plurality of first point light sources and the plurality of light sensitive units.

In some embodiments, orthographic projections of the plurality of first point light sources on a plane where the plurality of light sensitive units are located are respectively within orthographic projections of the plurality of first optical filter units on the plane where the plurality of light sensitive units are located.

In some embodiments, the plurality of first optical filter units are discrete.

Embodiments of the present disclosure further provide a display substrate, comprising: the above fingerprint identification assembly; and a plurality of sub-pixels arranged in an array, each of the plurality of sub-pixels comprising a light-emitting element, and the first point light source and the second point light source of the fingerprint identification assembly are light-emitting elements of the sub-pixels configured to emit lights of different colors, respectively.

In some embodiments, the light sensitive units and the optical filter layer of the fingerprint identification assembly are located in areas between adjacent ones of the sub-pixels; and the optical filter layer is provided at the light entry side of the light sensitive units, and the first optical filter unit of the optical filter layer is provided only at the light entry side of the light sensitive unit that is closer to the sub-pixel of which the light-emitting element serves as the first point light source than to the sub-pixel of which the light-emitting element serves as the second point light source.

In some embodiments, the optical filter layer further comprises second optical filter units, the second optical filter units are disposed in all areas of the optical filter layer except the first optical filter units, and the second optical filter unit is configured to filter out ambient light passing through the finger; and the second optical filter unit of the optical filter layer is provided only at the light entry side of the light sensitive unit that is closer to the sub-pixel of which the light-emitting element serves as the second point light source than to the sub-pixel of which the light-emitting element serves as the first point light source.

In some embodiments, the light sensitive unit comprises a light sensitive diode and a first thin film transistor, the sub-pixel further comprises a second thin film transistor electrically connected to an anode of the light-emitting element, the first thin film transistor and the second thin film transistor are provided in a same layer, and the optical filter layer is located on a light entry side of the light sensitive diode.

In some embodiments, the display substrate further comprises a base substrate, and the light sensitive unit of the fingerprint identification assembly is located on a non-light exit side of the base substrate; and the optical filter layer is located between the base substrate and the light sensitive unit, and an orthographic projection of the sub-pixel of which the light-emitting element serves as the first point light source on the base substrate is within an orthographic projection of the first optical filter unit of the optical filter layer on the base substrate.

In some embodiments, an orthographic projection of the sub-pixel of which the light-emitting element serves as the second point light source on the base substrate is within an orthographic projection of the second optical filter unit of the optical filter layer on the base substrate.

In some embodiments, the sub-pixels comprises a red sub-pixel, a green sub-pixel and a blue sub-pixel, the first point light source is the light-emitting element of the green sub-pixel, and the second point light source is the light-emitting element of the blue sub-pixel.

Embodiments of the present disclosure further provide a display panel, comprising: the above display substrate.

Embodiments of the present disclosure provide a fingerprint identification method of the above display panel, the method comprising: at a first stage of fingerprint identification, lighting up the light-emitting element of the sub-pixel serving as the first point light source, while keeping the light-emitting elements of remaining sub-pixels from emitting light, wherein the light sensitive unit of the display panel receives the first signal light reflected by the finger, and the first optical filter unit prevents the first signal light reflected by the finger from irradiating at least the predetermined portion of the non-imaging area of the light sensitive units; and at a second stage of fingerprint identification, lighting up the light-emitting element of the sub-pixel serving as the second point light source, while keeping the light-emitting elements of remaining sub-pixels from emitting light, wherein the light sensitive unit receives the second signal light reflected by the finger; and a part of the second signal light reflected by the finger is irradiated to the non-imaging area of the light sensitive units through the first filter unit, and is combined with the received first signal light, to obtain a full fingerprint image.

BRIEF DESCRIPTION OF THE DRAWINGS

In order to more clearly explain the embodiments of the present disclosure or the technical solutions in the prior art, the following will briefly introduce the drawings used in the description of the embodiments or the prior art. Obviously, the drawings in the following description are only some embodiments of the present disclosure. For those of ordinary skill in the art, without paying any creative labor, other drawings can also be obtained based on these drawings.

DETAILED DESCRIPTION OF EMBODIMENTS

Figure 1:
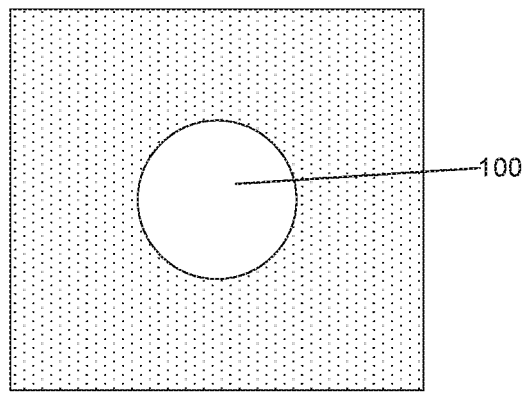
FIG. 1 is a schematic diagram of a point light source according to an embodiment of the present disclosure.

The technical solutions in the embodiments of the present disclosure will be described clearly and completely in the following with reference to the drawings in the embodiments of the present disclosure. Obviously, the described embodiments are only some embodiments of the present disclosure, not all of them. Based on the embodiments in the present disclosure, all other embodiments obtained by those of ordinary skill in the art without making creative efforts fall within the protection scope of the present disclosure.

In the embodiments of the present disclosure, the words "first", "second", etc. are used to distinguish the same items or similar items whose functions and effects are basically the same, only to clearly describe the technical solutions of the embodiments of the present disclosure, and should not be understood as indicating or implying relative importance or implicitly indicating the number of technical features indicated.

In the embodiments of the present disclosure, the meaning of "plurality of" is two or more, unless otherwise specifically defined. In addition, the orientation or positional relationship indicated by the terms "upper", "lower", etc. is based on the orientation or positional relationship shown in the drawings, only for the convenience of describing the present disclosure and simplifying the description, rather than indicating or implying the device or elements must have a specific orientation, be constructed and operated in a specific orientation, and therefore cannot be construed as limiting the present disclosure.

Figure 2:
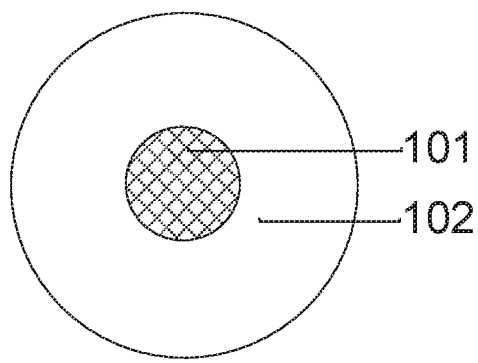
FIG. 2 is a schematic diagram of an image formed on a sensor by the light emitted by the point light source shown in FIG. 1.

In some embodiments of the present disclosure, when the fingerprint recognition is performed in the display area, a point light source is used to collect fingerprint information. The image formed by the point light source 100 shown in FIG. 1 on the sensor is shown in FIG. 2. The image formed by lighting up a point light source on the sensor includes two areas: one area is a non-imaging area 101 where fingerprints cannot be imaged; and the other area is an imaging area 102 where fingerprints can be imaged.

Figure 3:
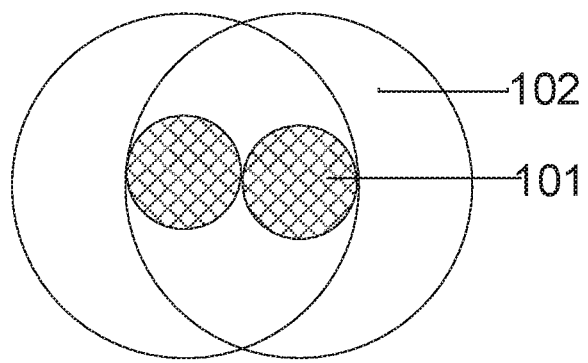
FIG. 3 is a schematic diagram of an image formed on a sensor by the light emitted by two point light sources.

If a full fingerprint image is required, the image corresponding to the non-imaging area needs to be supplemented in the non-imaging area. In order to solve this problem, as shown in FIG. 3, two point light sources can be used to realize complementary imaging, and then obtain a full fingerprint imaging. Since the images formed by the two point light sources partially overlaps, the two point light sources need to be lit in different times. However, due to the lag problem of the photosensor, when one point light source is lit the second time, the light information received by the photosensor will be affected by the light information received by the photosensor when the other point light source is lit the first time. Then, in order to eliminate the lag problem, it is generally necessary to wait until the lag terminates before the one point light source can be lit the second time. This undoubtedly prolongs the interval between the two lightings of the point light sources, which greatly prolongs the fingerprint collection time and reduces the fingerprint collection efficiency.

In related art, the fingerprint recognition technology in the display area mainly uses collimated light path and pinhole technology, and point light source technology to realize fingerprint collection. The fingerprint collection process will be briefly described below by taking the sensor 104 shown in FIG. 4 disposed on the non-light-exit side of the OLED back plate 105 as an example.

Figure 4:
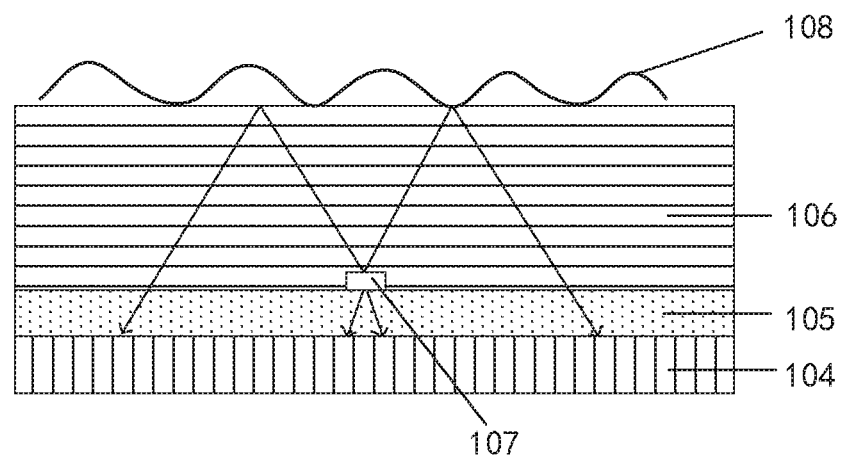
FIG. 4 is a schematic structural diagram of a display panel according to an embodiment of the present disclosure.
Figure 5:
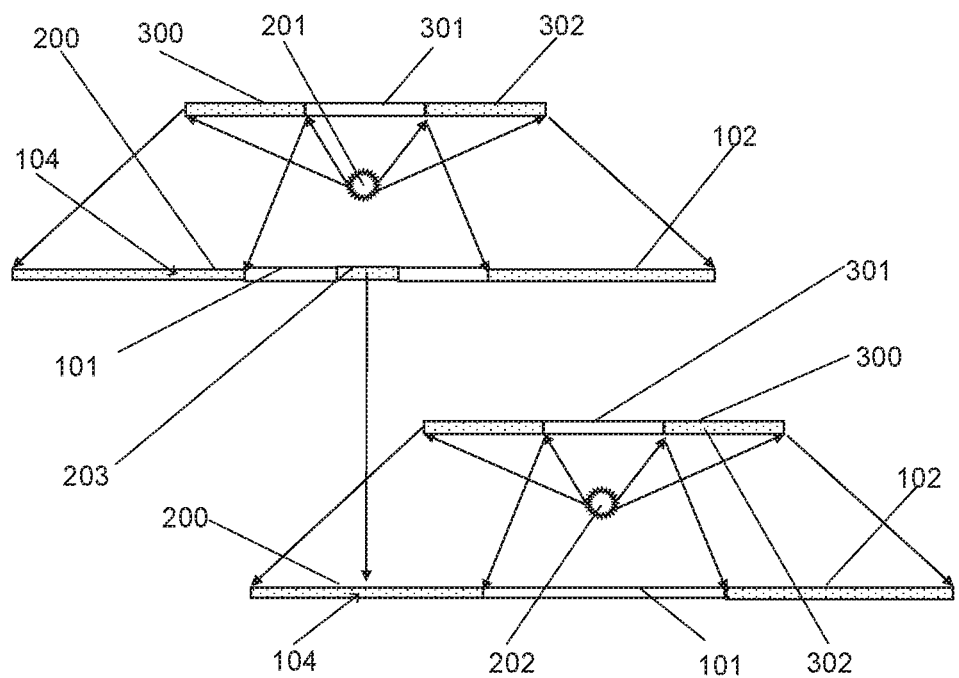
FIG. 5 is a schematic diagram of a principle of forming an image on a sensor by two point light sources according to an embodiment of the present disclosure.

Referring to FIG. 4, when the finger fingerprint 108 touches the OLED display module 106, the point light source 107 in the OLED display module 106 is lit, and signal light is emitted and is reflected by the finger onto the sensor 104, thereby forming an imaging area and a non-imaging area. Referring to FIG. 5, the finger is placed on the object surface 300. Corresponding to the point light source 201 (for example, green point light source), the object surface 300 of the finger has an imaging area 302 and a non-imaging area 301. Corresponding to the point light source 202 (for example, blue point Light source), the object surface 300 of the finger has an imaging area 302 and a non-imaging area 301. Part of the fingerprint in the imaging area 302 can be imaged, and part of the fingerprint in the non-imaging area 301 cannot be imaged. After the point light source 201 is lit, an imaging area 102 and a non-imaging area 101 are formed on the sensor image surface 200 of the sensor 104. After the point light source 202 is lit, an imaging area 102 and a non-imaging area 101 are formed on the sensor image surface 200 of the sensor 104. The non-imaging area 101 of the point light source 201 is complemented by the imaging area 102 formed by lighting up the point light source 202, and the non-imaging area 101 of the point light source 202 is complemented by the imaging area 102 formed by the point light source 201. After the point light source 201 is lit, a lag 203 is formed in the non-imaging area 101 of the sensor. Although the point light source 201 has been turned off, after the point light source 202 is lit, the lag 203 will destroy the imaging area 102 of the sensor 104 after the point light source 202 is lit.

In order to eliminate the lag, it is generally necessary to wait for the lag to end before the point light source can be lit the second time. This undoubtedly prolongs the interval between the two lightings of the point light sources, which greatly prolongs the fingerprint collection time and reduces the fingerprint collection efficiency. After analysis and comparison, the inventor found that this effect only exists at the point where the light intensity is very strong, that is, the sensor area directly facing the point light source, and other imaging areas have no lag effect.

In order to solve the above problem, embodiments of the present disclosure provide a fingerprint identification assembly. The fingerprint identification assembly includes: a plurality of first point light sources and a plurality of second point light sources, the plurality of first point light sources being configured to emit a first signal light, the plurality of second point light sources configured to emit a second signal light after the first point light source emits the first signal light, the first signal light and the second signal light being lights of different colors; a plurality of light sensitive units configured to sequentially receive the first signal light and the second signal light reflected by a finger to identify a fingerprint; and an optical filter layer provided on a light entry side of the light sensitive unit, wherein the optical filter layer includes a plurality of first filter units, the first filter unit corresponds to a non-imaging area that is formed on the light sensitive units after the first point light source is lit, for filtering out the first signal light reflected by the finger. According to embodiments of the present disclosure, the first filter unit corresponds to the non-imaging area that is formed on the light sensitive units after the first point light source is lit, for preventing the first signal light reflected by the finger from irradiating at least a predetermined portion of the non-imaging area of the light sensitive units, and allowing the second signal light reflected by the finger to irradiate the non-imaging area of the light sensitive units. The predetermined portion of the non-imaging area may be the entire non-imaging area, or only a portion where the lag 203 (FIG. 5) may be formed.

In some embodiments of the present disclosure, a first wavelength of the first signal light emitted by the first point light source is greater than a second wavelength of the second signal light emitted by the second point light source. For example, the first optical filter unit is able to filter out light having a wavelength greater than or equal to a third wavelength and to transmit light having a wavelength less than the third wavelength, and the third wavelength is less than or equal to the first wavelength and greater than the second wavelength. According to exemplary embodiments of the present disclosure, the plurality of first optical filter units are discrete.

Types of the first point light source and the second point light source are not limited, and they may be OLED (Organic Light-Emitting Diode), LED (Light-Emitting Diode), etc., as point light sources. The arrangement of the above plurality of first point light sources and plurality of second point light sources is not limited, and can be determined according to the actual application device of the above fingerprint identification assembly.

The above-mentioned first signal light and second signal light are lights of different colors. For example, the first signal light may be green light and the second signal light may be blue light: of course, the first signal light may also be red light and the second signal light may also be blue light. It can be determined according to the actual situation.

The light entry side of the light sensitive unit mentioned above refers to the side that can receive light and sense changes in light intensity.

Figure 7:
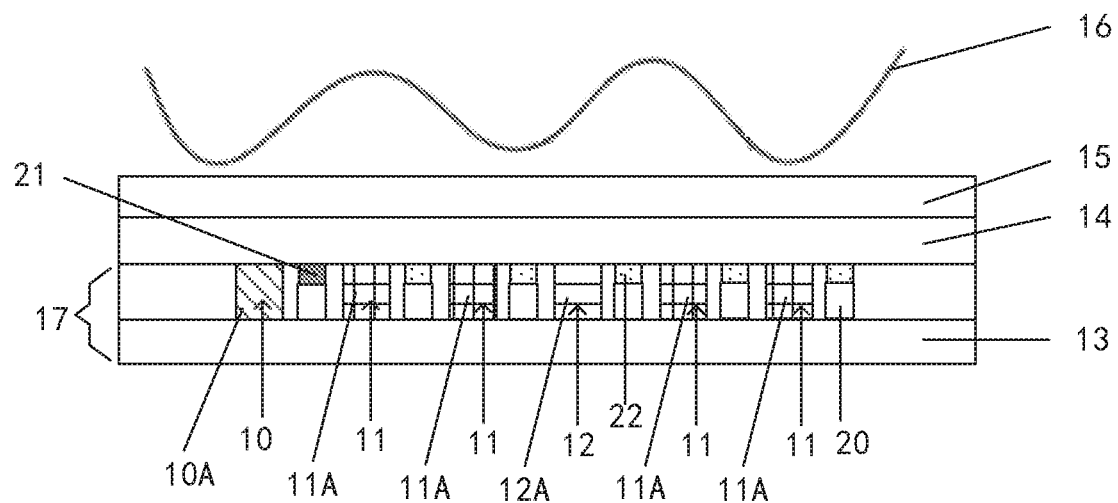
FIG. 7 is a schematic structural diagram of a display panel according to another embodiment of the present disclosure.

When the above fingerprint identification assembly is applied to the display substrate, the fingerprint identification assembly can be provided on the light exit side of a base substrate of the display substrate. In this case, specific structure defined by the first filter unit corresponding to the non-imaging area that is formed on the light sensitive units may be as follows. The optical filter layer is located above the light sensitive units, and the first optical filter units of the optical filter layer are adjacent to the sub-pixels serving as the first point light sources. For example, as shown in FIG. 7, the display substrate 17 includes a base substrate 13, and a plurality of sub-pixels arranged in an array, light sensitive units, and an optical filter layer, which are located on the base substrate 13. The sub-pixels 10 are used as first point light sources, the sub-pixels 12 are used as second point light sources, and the sub-pixels 11 between the sub-pixels 10 and the sub-pixels 12 are not used as point light source. The light sensitive units and the optical filter 9 layer are located between adjacent sub-pixels. The optical filter layer is located above the light sensitive units. The light sensitive units 20 and the first optical filter units 21 are disposed in the area between the sub-pixels 10 and the sub-pixels 11, and the light sensitive units 20 are disposed in both the area between adjacent sub-pixels 11 and the area between the sub-pixels 11 and the sub-pixel 12.

Figure 9:
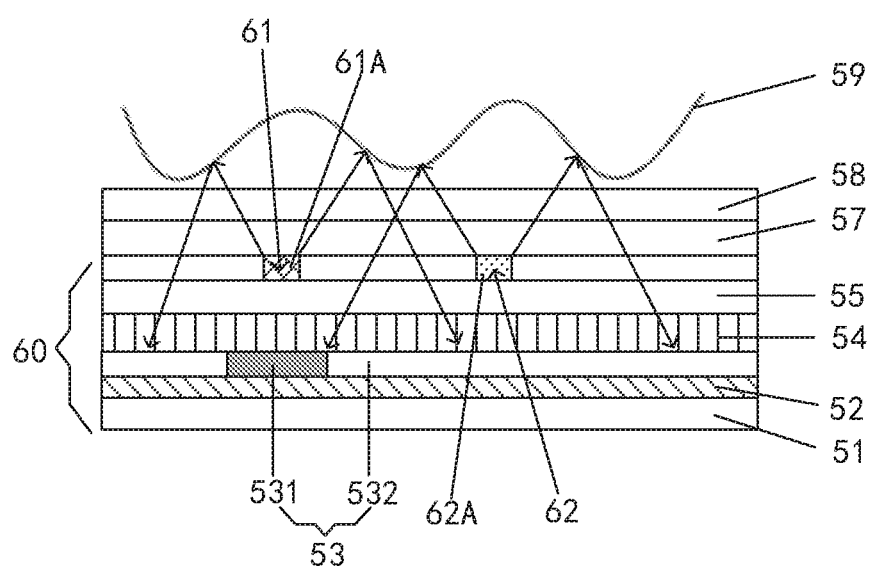
FIG. 9 is a schematic structural diagram of a display panel according to still another embodiment of the present disclosure.

Of course, the above fingerprint identification assembly can also be provided on the non-light exit side of the display substrate. In this case, specific structure defined by the first filter unit corresponding to the non-imaging area that is formed on the light sensitive units may be as follows. The optical filter layer is located between the base substrate and the light sensitive units. The orthographic projections of the sub-pixels serving as the first point light sources on the base substrate are within orthographic projections of the first optical filter units of the optical filter layer on the base substrate, respectively. For example, as shown in FIG. 9, the display substrate includes a base substrate 55. The light sensitive units 52 of the fingerprint identification assembly are located on the non-light exit side of the base substrate 55; the optical filter layer 53 is located between the base substrate 55 and the light sensitive units 52, and the orthographic projections of the sub-pixels 61 serving as the first point light sources on the base substrate 55 are within orthographic projections of the first optical filter units 531 of the optical filter layer on the base substrate 55, respectively.

Embodiments of the present disclosure provide the fingerprint identification assembly. The fingerprint identification assembly includes: a plurality of first point light sources and a plurality of second point light sources, the plurality of first point light sources being configured to emit a first signal light, the plurality of second point light sources configured to emit a second signal light after the first point light source emits the first signal light, the first signal light and the second signal light being lights of different colors; a plurality of light sensitive units configured to sequentially receive the first signal light and the second signal light reflected by a finger to identify a fingerprint; and an optical filter layer provided on a light entry side of the light sensitive unit, wherein the optical filter layer includes a plurality of first filter units, the first filter unit corresponds to a non-imaging area that is formed on the light sensitive units after the first point light source is lit, for filtering out the first signal light reflected by the finger.

In this way, when the fingerprint identification assembly performs fingerprint recognition, the first point light sources are lit, and a non-imaging area and an imaging area are formed on the light sensitive units; then the second point light source is lighted up and the first point light source is turned off. Since the optical filter layer is disposed on the light entry side of the light sensitive units, the first optical filter units of the optical filter layer will filter out the first signal light reflected by the finger The non-imaging area formed by lighting up the first point light sources will not receive light, and thus will not generate a lag, so that the second point light source can be lit without waiting for the lag to end. That is, the fingerprint identification assembly can remove the influence of the lag on fingerprint collection, greatly reducing the interval between the two lightings of the point light sources, and improving the fingerprint collection efficiency.

When the finger is pressed on the fingerprint identification assembly, the ambient light can penetrate the finger and affect the light received by the light sensitive units, thereby affecting the accuracy of fingerprint recognition. In order to eliminate the influence of ambient light on fingerprint recognition, thereby improving the accuracy of fingerprint recognition, in some embodiments of the present disclosure, the optical filter layer further includes second optical filter units, and the second optical filter units are disposed in areas of the optical filter layer except the first optical filter units. The second optical filter units are configured to filter out the ambient light that passes through the finger.

In some embodiments of the present disclosure, the first point light source is a light source configured to emit green light and the second point light source is a light source configured to emit blue light; the first optical filter unit is used to filter out light with a wavelength greater than or equal to 490 nm, and the second optical filter unit is used to filter out light with a wavelength greater than or equal to 650 nm. Only a part of the ambient light with a wavelength greater than or equal to 650 nm can pass through the finger, while green light has a wavelength greater than or equal to 490 nm and blue light has a wavelength less than or equal to 480 nm. Then, after lighting up the light source configured to emit green light, the first optical filter units can simultaneously filter out the ambient light and green light directed to the non-imaging area of the light sensitive units, and the second optical filter units can filter out the ambient light directed to other areas of the light sensitive units, which eliminates the effects of ambient light while eliminating the lag, improving the efficiency of fingerprint collection and the accuracy of fingerprint recognition.

Figure 6:
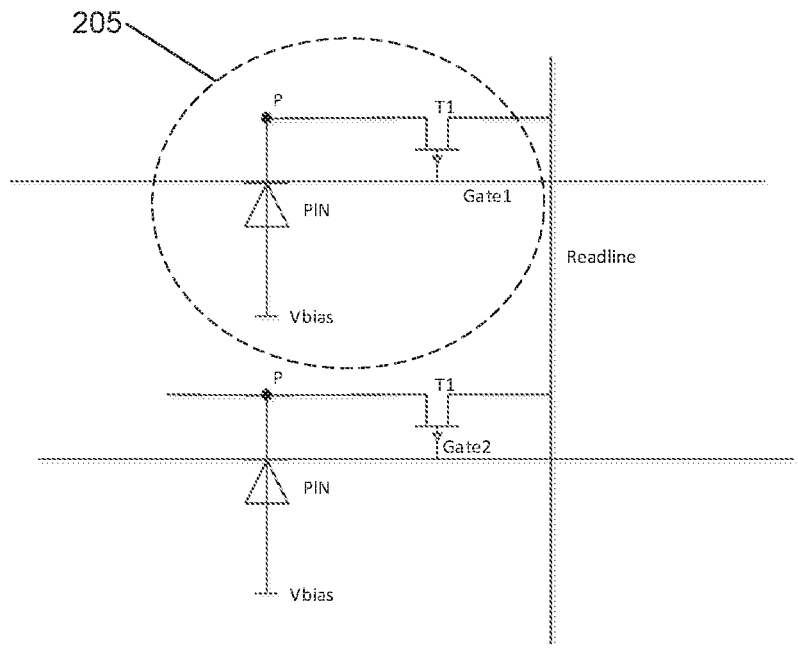
FIG. 6 is a schematic structural diagram of a light sensitive unit according to an embodiment of the present disclosure.

In some embodiments of the present disclosure, each of the light sensitive units includes: a light sensitive diode configured to sense a light intensity change produced by a finger when the finger is pressed on the assembly; and a first thin film transistor configured to control an output of the light sensitive diode. The structure of the light sensitive unit here belongs to a structure constituted by the thin film transistor TFT and the light sensitive diode PIN. As shown in FIG. 6, the light sensitive unit 205 includes a light sensitive diode PIN and a first thin film transistor T1. One end of the light sensitive diode PIN is connected to a bias voltage Vbias, and the other end is connected to a node P. The node P is connected to the source electrode of the first thin film transistor T1. The gate electrode of the first thin film transistor T1 is connected to the signal line Gate1, and the drain electrode of the first thin film transistor T1 is connected to the read signal line Readline. The turn-on and turn-off of the first thin film transistor T1 is controlled by the signal line Gate1, and thus the output of the light sensitive diode PIN to the read signal line Readline is controlled.

Embodiments of the present disclosure also provide a display substrate including the abovementioned fingerprint identification assembly. The display substrate further includes: a plurality of sub-pixels arranged in an array, each of the plurality of sub-pixels including a light-emitting element, and the first point light source and the second point light source of the fingerprint identification assembly are light-emitting elements of the sub-pixels configured to emit light of different colors, respectively.

The above sub-pixels may be a green sub-pixel configured to emit green light, a red sub-pixel configured to emit red light, and a blue sub-pixel configured to emit blue light.

The first point light sources may be green sub-pixels, the second point light sources may be blue sub-pixels; of course, the first point light sources may also be red sub-pixels, and the second point light sources may also be blue sub-pixels. It can be determined according to the actual situation.

The above fingerprint identification assembly may be provided on the light exit side of the base substrate of the display substrate, or may be provided on the non-light exit side of the base substrate of the display substrate, which is not limited herein.

Embodiments of the present disclosure provide a display substrate. The fingerprint identification assembly included in the display substrate can remove the influence of the lag on fingerprint collection, greatly reducing the interval between the two lightings of the point light sources and improving fingerprint collection efficiency.

In some embodiments of the present disclosure, the fingerprint identification assembly is provided on the light exit side of the base substrate of the display substrate. Referring to FIG. 7, the light sensitive units and optical filter layer of the fingerprint identification assembly are located in the area between adjacent sub-pixels: the optical filter layer is located above the light sensitive units, and the first optical filter units of the optical filter layer are adjacent to the light-emitting elements of the sub-pixels serving as the first point light sources, and the second optical filter units of the optical filter layer are adjacent to the light-emitting elements of other sub-pixels. For example, the optical filter layer is provided at the light entry side of the light sensitive unit, and the first optical filter units of the optical filter layer is provided only at the light entry side of the light sensitive units which are closer to the sub-pixel of which the light-emitting element serves as the first point light source than to the sub-pixel of which the light-emitting element serves as the second point light source. The optical filter layer further includes second optical filter units, the second optical filter units are disposed in all areas other than the first optical filter units in the optical filter layer, and the second optical filter unit is configured to filter out ambient light passing through the finger; and the second optical filter unit of the optical filter layer is provided at the light entry side of the light sensitive unit which is closer to the sub-pixel of which the light-emitting element serves as the second point light source than to the sub-pixel of which the light-emitting element serves as the first point light source.

In some embodiments of the present disclosure, referring to FIG. 7, the display substrate 17 includes a base substrate 13, and a plurality of sub-pixels arranged in an array, the light sensitive units and the optical filter layer located on the base substrate 13. Each of the plurality of sub-pixels includes a light-emitting element. The light-emitting elements 10A of the sub-pixels 10 are used as first point light sources, and the light-emitting elements 12A of the sub-pixels 12 are used as second point light sources. The light-emitting elements 11A of the sub-pixels 11 between the sub-pixels 10 and the sub-pixels 12 are not used as point light sources. The light sensitive units and the optical filter layer are located between adjacent sub-pixels. The optical filter layer is located above the light sensitive units. The light sensitive units 20 and the first optical filter units 21 are disposed in the area between the sub-pixels 10 and the sub-pixels 11, and the light sensitive units 20 and the second optical filter units 22 are disposed in both the area between adjacent sub-pixels 11 and the area between the sub-pixels 11 and the sub-pixel 12. There are two sub-pixels 11 between the light-emitting elements 10A of the sub-pixels 10 serving as the first point light source and the light-emitting elements 12A of the sub-pixels 12 serving as the second point light source in FIG. 7, which is not limited here and can be determined according to the actual situation.

In some embodiments of the present disclosure, referring to FIG. 7, if the sub-pixel 10 is green sub-pixel and the sub-pixel 12 is blue sub-pixel, the first optical filter unit 21 is used to filter out light with a wavelength greater than or equal to 490 nm, and the second optical filter unit 22 is used to filter out light with a wavelength greater than or equal to 650 nm. When finger fingerprint 16 touches the display substrate, the sub-pixel 10 is lit, and the first optical filter unit 21 adjacent to the sub-pixel 10 can simultaneously filter out ambient light and green light that are directed to the non-imaging area of the light sensitive unit 20. For example, referring to FIGS. 2 and 4, the point light source emits light toward the finger fingerprint 16 at a beam angle of 42 degrees, and the light is reflected by the finger fingerprint 16 to the light sensitive unit 20, forming the non-imaging area 101 and the imaging area 102 on the light sensitive unit 20. The second optical filter units 22 can filter out ambient light directed to other areas of light sensitive unit, thereby eliminating the effects of ambient light while eliminating the lag, and thus improving the efficiency of fingerprint collection and the accuracy of fingerprint recognition. In addition, when the display panel including the display substrate is used to display images, since the optical filter layer is disposed in the area between adjacent sub-pixels, it will not affect the normal display.

In some embodiments of the present disclosure, referring to FIG. 7, after the display substrate 17 and the packaging substrate 14 are assembled with each other, a cover 15 is provided to form a display panel. If the display substrate 17 is an OLED display substrate, the display panel is an OLED display panel, which belongs to in-cell structure.

In some embodiments of the present disclosure, referring to FIG. 7, in a predetermined arrangement direction (for example, the left-right direction in FIG. 7), a plurality of light sensitive unit groups in the plurality of light sensitive units 20 are arranged alternately with a plurality of point light sources composed of the plurality of first point light sources 10A and the plurality of second point light sources 12A, and the plurality of first point light sources 10A and the plurality of second point light sources 12A are alternately arranged, and each of the plurality of light sensitive unit groups includes at least one light sensitive unit 20. In an exemplary embodiment, referring to FIG. 7, each of the plurality of light sensitive unit groups includes a plurality of light sensitive units 20; and, the first optical filter units 21 are respectively provided only at the light entry sides of the light sensitive units 20 which belong to the light sensitive unit group between the adjacent first point light source 10A and second point light source 12A in the predetermined arrangement direction and which are closer to the first point light source 10A than to the second point light source 12A in the predetermined arrangement direction; or the first optical filter unit 21 is provided only at the light entry side of the light sensitive unit 20 which belongs to the light sensitive unit group between the adjacent first point light source 10A and second point light source 12A in the predetermined arrangement direction and which is closer to the first point light source 10A than to the second point light source 12A in the predetermined arrangement direction. That is, referring to FIG. 7, among the light sensitive units 20 between the first point light source 10A and the second point light source 12A, the first optical filter units 21 are disposed on the light entry sides of the leftmost one or more light sensitive units 20, or the first optical filter units 21 are disposed on the light entry sides of the one or more light sensitive units 20 that are closest to the first light source 10A.

Figure 8:
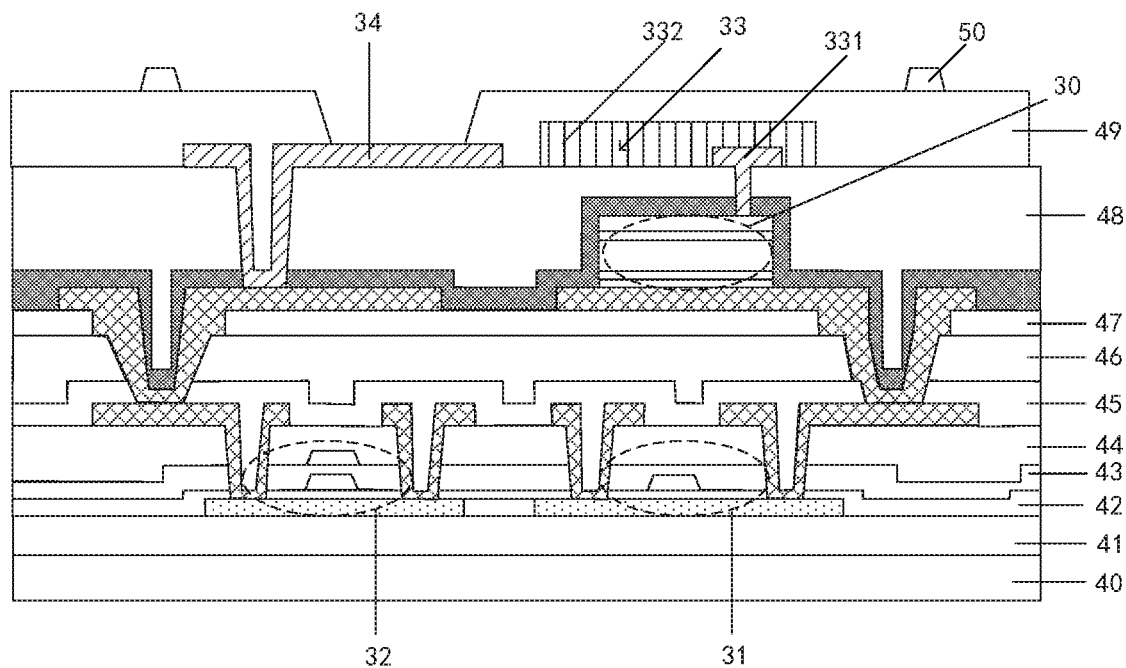
FIG. 8 is a schematic structural diagram of a display substrate according to an embodiment of the present disclosure.

In some embodiments of the present disclosure, referring to FIG. 8, the light sensitive unit includes a light sensitive diode 30 and a first thin film transistor 31, and the sub-pixel includes an anode 34 and a second thin film transistor 32 electrically connected to the anode 34, the first thin film transistor 31 is arranged in the same layer as the second thin film transistor 32, and the optical filter layer 33 is located above the light sensitive diode 30 or at the light entry side of the light sensitive diode 30. The optical filter layer 33 includes a first optical filter unit 331, and a portion of the area of the optical filter layer 33 serves as the second optical filter unit 332. The light-emitting element of the sub-pixel includes this anode 34.

In some embodiments of the present disclosure, referring to FIG. 8, the display substrate includes a base substrate 40, and a buffer layer 41, a first thin film transistor 31, a second thin film transistor 32, a gate insulating layer 42, a first insulating layer 43, a second insulating layer 44, a first protective layer 45, a third insulating layer 46, a second protective layer 47, the anode 34, the light sensitive diode (PIN) 30, a third protective layer 48, the optical filter layer 33, a pixel definition layer (PDL) 49, and a spacer (PS) 50, on the base substrate 40.

The light sensitive diode (PIN) 30 may include an N-aSi (N-type doped amorphous silicon) layer, and an I-aSi (I-type doped amorphous silicon) layer, P-aSi (P Type doped amorphous silicon) layer, and an ITO (Indium Tin Oxide) layer, which are disposed on the N-aSi layer. Of course, the light sensitive diode may also have other structures, which are not limited here. The material of the above optical filter layer may be resin.

Types of the first thin film transistor 31 and the second thin film transistor 32 are not limited, and FIG. 8 illustrates the polycrystalline silicon TFT as an example. The arrangement of the first thin film transistor and the second thin film transistor in the same layer means that the first thin film transistor and the second thin film transistor are fabricated in one patterning process. The one patterning process refers to a process for forming a required structure of a layer by a single exposure. One patterning process includes coating, exposure, development, etching and stripping.

The light sensitive units are integrated into the OLED cell, and the light sensitive unit is made in the OLED cell, that is, the light sensitive diode is made around the sub-pixels (in the area where the pixel definition layer is located), and then the optical filter layer is made after the metal anode has been made.

In some embodiments of the present disclosure, the fingerprint identification assembly is provided on the non-light exit side of the base substrate of the display substrate. As shown in FIG. 9, the display substrate further includes a base substrate 55, and the light sensitive unit 52 of the fingerprint identification assembly is located on the non-light exit side of the base substrate 55. The optical filter layer 53 is located between the base substrate 55 and the light sensitive unit 52. The orthographic projection of the light-emitting element 61A of the sub-pixel 61 serving as the first point light source on the base substrate 55 is within the orthographic projection of the first optical filter unit 531 of the optical filter layer 53 on the base substrate 55, and the orthographic projection of light-emitting elements of other sub-pixels (such as the light-emitting element 62A of the sub-pixel 62 serving as the second point light source in FIG. 9) on the base substrate 55 is within the orthographic projection of the second optical filter unit 532 of the optical filter layer 53 on the base substrate 55, that is, the orthographic projection of the light-emitting elements 62A of the sub-pixel 62 serving as the second point light source on the base substrate 55 is within the orthographic projection of the second optical filter unit 532 of the optical filter layer 53 on the base substrate 55.

Figure 10:
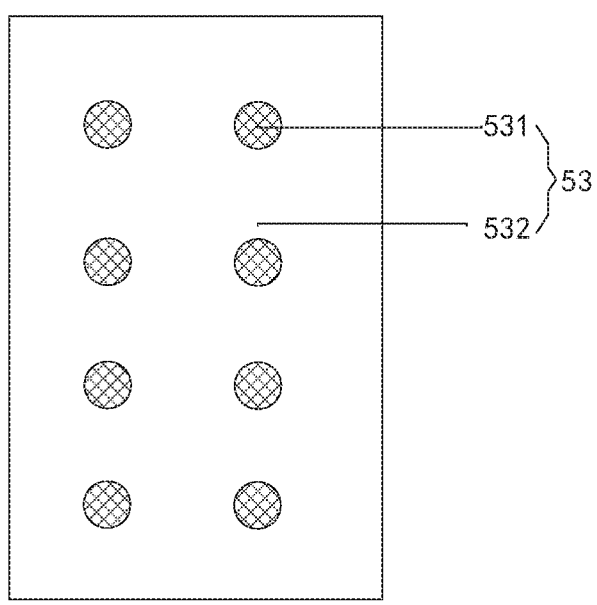
FIG. 10 is a schematic structural diagram of a filter layer according to an embodiment of the present disclosure.

The abovementioned orthographic projection of the light-emitting element of the sub-pixel serving as the first point light source on the base substrate refers to a projection of the light-emitting element of the sub-pixel serving as the first point light source on the base substrate in a direction perpendicular to the base substrate. The abovementioned orthographic projection of the first optical filter unit on the base substrate refers to a projection of the first optical filter unit on the base substrate in the direction perpendicular to the base substrate. The abovementioned orthographic projection of the light-emitting elements of the other sub-pixel on the base substrate refers to a projection of the light-emitting elements of the other sub-pixel on the base substrate in the direction perpendicular to the base substrate. The abovementioned orthographic projection of the second optical filter unit on the base substrate refers to a projection of the second optical filter unit on the base substrate in the direction perpendicular to the base substrate. A top view of the above optical filter layer can be as shown in FIG. 10.

Referring to FIG. 9, if the sub-pixel 61 is green sub-pixel and the sub-pixel 62 is blue sub-pixel, the first optical filter unit 531 is used to filter out light with a wavelength greater than or equal to 490 nm, and the second optical filter unit 532 is used to filter out light with a wavelength greater than or equal to 650 nm, when the finger fingerprint 59 touches the display substrate, the light-emitting element 61A of the sub-pixels 61 is lit, and the first optical filter unit 531 which directly faces the light-emitting element 61A of the sub-pixel 61 can simultaneously filter out the ambient light and green light directed to the non-imaging area of the light sensitive unit 52, and the second optical filter unit 532 can filter out the ambient light directed to other areas of the light sensitive unit, eliminating the effects of ambient light while eliminating the lag, and thus improving the efficiency of fingerprint collection and the accuracy of fingerprint recognition.

Referring to FIG. 9, the light sensitive unit 52 can be fabricated on a glass base substrate 51, which is more suitable for manufacturing a large-sized display substrate than a silicon substrate.

Referring to FIG. 9, after the display substrate 60 and the packaging substrate 57 are assembled to each other, a cover 58 is provided to form a display panel. The display substrate 60 is an OLED display substrate, and the display panel is an OLED display panel. The fingerprint identification assembly is located under the screen of the display panel. The light emitted by the light emitting elements 61A and 62A in FIG. 9 and the light reflected by the finger fingerprint 59 are indicated by straight lines with arrows.

In some embodiments of the present disclosure, the optical filter layer 53 is provided on the non-light exit side of the base substrate 55 through a coating process; or, referring to FIG. 9, the optical filter layer 53 is adhered to the non-light exit side of the base substrate 55 through the adhesive layer 54. The adhesive layer 54 may be an adhesive material, and the optical filter layer 53 may be PET (Polyethylene Terephthalate).

In some embodiments of the present disclosure, referring to FIG. 9, the orthographic projections of the plurality of first point light sources 61A on the plane where the plurality of light sensitive units 52 are located are respectively within the orthographic projections of the plurality of first optical filter units 531 on the plane where the plurality of light sensitive unit 52 is located.

In the above embodiments of the present disclosure, filtering is performed at a fixed position, and then the order of lighting is combined to achieve the elimination of lag.

In some embodiments of the present disclosure, the above sub-pixels include red sub-pixels, green sub-pixels, and blue sub-pixels. Considering that the optical filter layer absorbs green light better, in order to eliminate the lag better, the first point light source is the light emitting element of the green sub-pixel and the second point light source is the light emitting element of the blue sub-pixel.

Embodiments of the present disclosure further provide a display panel including the abovementioned display substrate.

The display panel may be a flexible display panel (also called a flexible screen) or a rigid display panel (that is, a display panel that cannot be bent), which is not limited here. The display panel may be an OLED (Organic Light-Emitting Diode) display panel, and may also be any product or component with a fingerprint recognition function such as a TV, digital camera, mobile phone, tablet computer, etc. including the OLED display panel.

When the display panel is performing fingerprint recognition, the influence of the lag on fingerprint collection can be removed, greatly reducing the interval between the two lightings of the point light sources and improving fingerprint collection efficiency.

Embodiments of the present disclosure further provide a fingerprint identification method applied to the display panel according to embodiments of the present disclosure.

The method includes:

at a first stage of fingerprint identification, lighting up the light-emitting element of the sub-pixel serving as the first point light source, while keeping the light-emitting elements of remaining sub-pixels from emitting light, wherein the light sensitive unit of the display panel receives the first signal light reflected by the finger, and the first optical filter unit prevents the first signal light reflected by the finger from irradiating at least the predetermined portion of the non-imaging area of the light sensitive units; and at a second stage of fingerprint identification, lighting up the light-emitting element of the sub-pixel serving as the second point light source, while keeping the light-emitting elements of remaining sub-pixels from emitting light, wherein the light sensitive unit receives the second signal light reflected by the finger; and a part of the second signal light reflected by the finger is irradiated to the non-imaging area of the light sensitive units through the first filter unit, and is combined with the received first signal light, to obtain a full fingerprint image.

The color of the light emitted by the light-emitting elements of the sub-pixels serving as the first point light sources and the color of the light emitted by the light-emitting elements of the sub-pixels serving as the second point light sources are not limited herein. For example, if the first point light sources included in the display panel are light-emitting elements of green sub-pixels, and the second point light sources are light-emitting elements of blue sub-pixels, at the first stage of fingerprint recognition the light-emitting elements of the green sub-pixels serving as the first point light sources are lit; at the second stage of fingerprint recognition, the light-emitting elements of the blue sub-pixels serving as the second point light sources are lit. In the two lighting processes, the different colors of the lit light sources will cause the response of the light sensitive units to be different. The blue response is relatively small, and the exposure times of the two lightings can be adjusted to achieve the signal uniformity.

Embodiments of the present disclosure provide a fingerprint identification method. Applying the fingerprint identification method to the display panel can remove the influence of the lag on fingerprint collection, greatly reducing the interval between the two lightings of the point light sources and improving fingerprint collection efficiency.

The above embodiments are only specific implementations of the present disclosure, but the scope of protection of the present disclosure is not limited to the embodiments, and those skilled in the art can easily think of changes or replacements within the technical scope disclosed in the present disclosure. The changes or replacements should be covered by the protection scope of the present disclosure. Therefore, the protection scope of the present disclosure should be defined by the protection scope of the claims.

What is claimed is:

1. A fingerprint identification assembly, comprising:
    a plurality of first point light sources, configured to emit a first signal light;
    a plurality of second point light sources configured to emit a second signal light after the first point light source emits the first signal light, the first signal light and the second signal light being lights of different colors;
    a plurality of light sensitive units configured to sequentially receive the first signal light and the second signal light reflected by a finger to identify a fingerprint; and
    an optical filter layer provided on a light entry side of the light sensitive unit, wherein the optical filter layer comprises a plurality of first filter units, the first filter unit corresponds to a non-imaging area that is formed on the light sensitive units after the first point light source is lit, for preventing the first signal light reflected by the finger from irradiating at least a predetermined portion of the non-imaging area of the light sensitive units, and allowing the second signal light reflected by the finger to irradiate the non-imaging area of the light sensitive units,
    wherein the optical filter layer further comprises second optical filter units, the second optical filter units are disposed in all areas of the optical filter layer except the first optical filter units, and the second optical filter unit is configured to filter out ambient light passing through the finger.

2. The fingerprint identification assembly of claim 1, wherein:
    a first wavelength of the first signal light emitted by the first point light source is greater than a second wavelength of the second signal light emitted by the second point light source.

3. The fingerprint identification assembly of claim 2, wherein:
    the first optical filter unit is configured to filter out light having a wavelength greater than or equal to a third wavelength and to transmit light having a wavelength less than the third wavelength, and the third wavelength is less than or equal to the first wavelength and greater than the second wavelength.

4. The fingerprint identification assembly of claim 1, wherein:

the first point light source is a point light source configured to emit green light, and the second point light source is a point light source configured to emit blue light; and the first optical filter unit is configured to filter out light with a wavelength greater than or equal to 490 nm, and the second optical filter unit is configured to filter out light with a wavelength greater than or equal to 650 nm.

5. The fingerprint identification assembly of claim 1, wherein:
each of the light sensitive units comprises:
a light sensitive diode configured to sense a light intensity change produced by finger pressing; and
a first thin film transistor configured to control an output of the light sensitive diode.

6. The fingerprint identification assembly of claim 1, wherein:
in a predetermined arrangement direction, a plurality of light sensitive unit groups in the plurality of light sensitive units are arranged alternately with a plurality of point light sources composed of the plurality of first point light sources and the plurality of second point light sources, and the plurality of first point light sources and the plurality of second point light sources are alternately arranged, and
each of the plurality of light sensitive unit groups comprises at least one light sensitive unit.

7. The fingerprint identification assembly of claim 6, wherein:
each of the plurality of light sensitive unit groups comprises a plurality of light sensitive units; and, the first optical filter unit are provided only at the light entry sides of one or more light sensitive units which belong to the light sensitive unit group between the adjacent first point light source and second point light source in the predetermined arrangement direction and which are closer to the first point light source than to the second point light source in the predetermined arrangement direction.

8. The fingerprint identification assembly of claim 1, wherein:
in a predetermined arrangement direction, the plurality of first point light sources and the plurality of second point light sources are alternately arranged, and the plurality of first point light sources and the plurality of second point light sources are disposed at light entry side of the plurality of light sensitive units, and one first optical filter unit is provided only between each of the plurality of first point light sources and the plurality of light sensitive units.

9. The fingerprint identification assembly of claim 8, wherein:
orthographic projections of the plurality of first point light sources on a plane where the plurality of light sensitive units are located are respectively within orthographic projections of the plurality of first optical filter units on the plane where the plurality of light sensitive units are located.

10. The fingerprint identification assembly of claim 1, wherein:
the plurality of first optical filter units are discrete.

11. A display substrate, comprising:
the fingerprint identification assembly of claim 1; and
a plurality of sub-pixels arranged in an array, each of the plurality of sub-pixels comprising a light-emitting element, and the first point light source and the second point light source of the fingerprint identification assembly are light-emitting elements of the sub-pixels configured to emit lights of different colors, respectively.

12. The display substrate of claim 11, wherein:
the light sensitive units and the optical filter layer of the fingerprint identification assembly are located in areas between adjacent ones of the sub-pixels; and
the optical filter layer is provided at the light entry side of the light sensitive units, and the first optical filter unit of the optical filter layer is provided only at the light entry side of the light sensitive unit that is closer to the sub-pixel of which the light-emitting element serves as the first point light source than to the sub-pixel of which the light-emitting element serves as the second point light source.

13. The display substrate of claim 12, wherein:
the light sensitive unit comprises a light sensitive diode and a first thin film transistor, the sub-pixel further comprises a second thin film transistor electrically connected to an anode of the light-emitting element, the first thin film transistor and the second thin film transistor are provided in a same layer, and the optical filter layer is located on a light entry side of the light sensitive diode.

14. The display substrate of claim 11, wherein:
the display substrate further comprises a base substrate, and the light sensitive unit of the fingerprint identification assembly is located on a non-light exit side of the base substrate; and
the optical filter layer is located between the base substrate and the light sensitive unit, and an orthographic projection of the sub-pixel of which the light-emitting element serves as the first point light source on the base substrate is within an orthographic projection of the first optical filter unit of the optical filter layer on the base substrate.

15. The display substrate of claim 14, wherein:
an orthographic projection of the sub-pixel of which the light-emitting element serves as the second point light source on the base substrate is within an orthographic projection of the second optical filter unit of the optical filter layer on the base substrate.

16. The display substrate of claim 11, wherein:
the sub-pixels comprises a red sub-pixel, a green sub-pixel and a blue sub-pixel, the first point light source is the light-emitting element of the green sub-pixel, and the second point light source is the light-emitting element of the blue sub-pixel.

17. A display panel, comprising:
the display substrate of claim 11.

18. A fingerprint identification method of the display panel of claim 17, the method comprising:
at a first stage of fingerprint identification, lighting up the light-emitting element of the sub-pixel serving as the first point light source, while keeping the light-emitting elements of remaining sub-pixels from emitting light, wherein the light sensitive unit of the display panel receives the first signal light reflected by the finger, and the first optical filter unit prevents the first signal light reflected by the finger from irradiating at least the predetermined portion of the non-imaging area of the light sensitive units; and
at a second stage of fingerprint identification, lighting up the light-emitting element of the sub-pixel serving as the second point light source, while keeping the light-emitting elements of remaining sub-pixels from emitting light, wherein the light sensitive unit receives the second signal light reflected by the finger; and a part of the second signal light reflected by the finger is irradiated to the non-imaging area of the light sensitive units through the first filter unit, and is combined with the received first signal light, to obtain a full fingerprint image.

* * * * *